(12) United States Patent
Miedema

(10) Patent No.: US 9,634,206 B1
(45) Date of Patent: Apr. 25, 2017

(54) LED LUMINAIRE

(71) Applicant: CSE, Inc., Norton Shores, MI (US)

(72) Inventor: Gregory A. Miedema, Spring Lake, MI (US)

(73) Assignee: CSE, Inc., Norton Shores, MI (US)

( * ) Notice: Subject to any disclaimer, the term of this patent is extended or adjusted under 35 U.S.C. 154(b) by 0 days.

(21) Appl. No.: 15/144,161

(22) Filed: May 2, 2016

Related U.S. Application Data

(60) Provisional application No. 62/155,195, filed on Apr. 30, 2015.

(51) Int. Cl.
| | |
|---|---|
| H01L 33/00 | (2010.01) |
| H01L 21/78 | (2006.01) |
| H01L 33/58 | (2010.01) |
| H01L 27/15 | (2006.01) |
| H01L 33/62 | (2010.01) |

(52) U.S. Cl.
CPC ............ *H01L 33/58* (2013.01); *H01L 27/156* (2013.01); *H01L 33/62* (2013.01)

(58) Field of Classification Search
None
See application file for complete search history.

(56) References Cited

U.S. PATENT DOCUMENTS

| | | |
|---|---|---|
| 4,967,317 A | 10/1990 | Plumly |
| 5,299,109 A | 3/1994 | Grondal |
| 5,857,767 A | 1/1999 | Hochstein |
| 6,045,243 A | 4/2000 | Muth et al. |
| 6,058,634 A | 5/2000 | McSpiritt |
| 6,154,945 A | 12/2000 | Voelzke |
| 6,375,340 B1 | 4/2002 | Biebl et al. |
| 6,502,956 B1 | 1/2003 | Wu |
| 6,666,563 B2 | 12/2003 | Brown |
| 6,945,683 B2 * | 9/2005 | Gross .................... F21S 48/215 362/158 |
| 7,121,675 B2 | 10/2006 | Ter-Hovhannisian |
| 7,128,442 B2 | 10/2006 | Lee et al. |
| 8,813,399 B2 | 8/2014 | Miedema et al. |
| 2004/0107615 A1 | 6/2004 | Pare |
| 2004/0264195 A1 | 12/2004 | Chang et al. |
| 2005/0157500 A1 | 7/2005 | Chen et al. |
| 2006/0059742 A1 | 3/2006 | Pan |
| 2006/0092637 A1 | 5/2006 | Yeh |
| 2008/0078733 A1 | 4/2008 | Nearman et al. |
| 2009/0010026 A1 | 1/2009 | Gai |
| 2009/0213583 A1 * | 8/2009 | Chang ...................... F21K 9/00 362/218 |

(Continued)

*Primary Examiner* — Khaja Ahmad
(74) *Attorney, Agent, or Firm* — Gardner, Linn, Burkhart & Flory, LLP

(57) ABSTRACT

A compact light unit having light emitting diodes (LEDs) includes a circuit board assembly and a lens including optical structures, a front face, and a rim disposed about the front face. The lens may include a pocket on a back portion of the lens opposite the front face within which the circuit board assembly is mounted with the LEDs being optically aligned with the optical structures. The LED light unit further includes a bezel having an interior opening with the bezel configured to be mounted to the lens with the rim engaged with an interior portion of the bezel and the front face exposed through the interior opening. Various optical structures may be provided to direct light projected by the LEDs at different angles.

23 Claims, 19 Drawing Sheets

(56) References Cited

U.S. PATENT DOCUMENTS

| | | |
|---|---|---|
| 2009/0296388 A1 | 12/2009 | Wu et al. |
| 2010/0073928 A1 | 3/2010 | Kim et al. |
| 2010/0219760 A1 | 9/2010 | Tanaka et al. |
| 2010/0231142 A1* | 9/2010 | Yoon ................. F21L 4/027 315/312 |
| 2011/0062471 A1* | 3/2011 | Bierhuizen ........... H01L 33/486 257/98 |
| 2011/0140633 A1* | 6/2011 | Archenhold ............ F21S 8/026 315/291 |

* cited by examiner

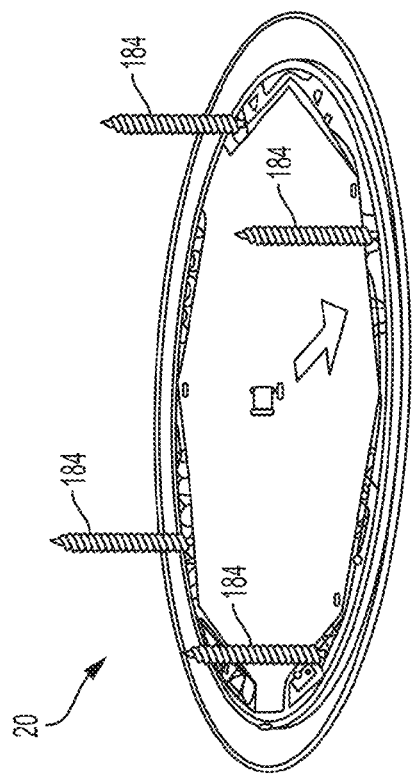
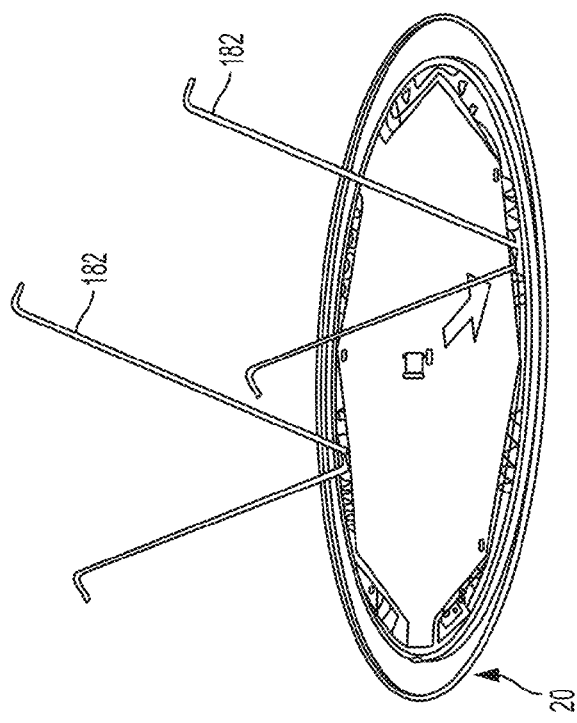
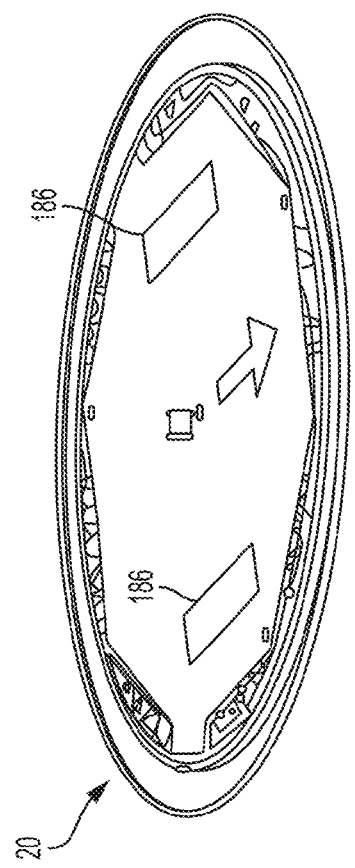
FIG. 13B
FIG. 13A
FIG. 13C

LED LUMINAIRE

CROSS REFERENCE TO RELATED APPLICATION

The present application claims priority of U.S. provisional patent application Ser. No. 62/155,195, filed Apr. 30, 2015, which is hereby incorporated herein by reference in its entirety.

BACKGROUND AND FIELD OF THE INVENTION

The present invention is directed to a light unit, and in particular to a compact LED light unit that includes optical structures for directing projected light.

Lighting is necessary in a broad array of applications, including interior residential and commercial lighting, cabinetry and office furniture lighting, and lighting of residential and commercial appliance units. LED lighting is known, but may require numerous LED lights to obtain the proper lighting for a given application or otherwise provide inadequate lighting of distally located objects.

SUMMARY OF THE INVENTION

The present invention provides a compact light unit utilizing LED lights that are optically aligned with optical structures located on a front cover or front cover assembly to provide a more efficient use of the light output of the light assembly for a lighting application.

According to an aspect of the present invention, a compact LED light unit, fixture, or luminaire with light unit including multiple LED devices or lights that project light into or at optical structures on the lens. The optical structures affect light emitted from the LED devices in desirable ways, as described below. The light unit is configured to removably mount to a surface, such as a wall, ceiling or cabinet, by various mounting features.

According to a further aspect of the present invention, an LED light unit comprises a circuit board assembly with a plurality of LEDs, and a lens including a plurality of optical structures, a front face, and a rim disposed about the front face. The lens further includes a pocket on a back portion of the lens opposite the front face which receives the circuit board assembly whereby the LEDs are optically aligned with the optical structures. The LED light unit further includes a bezel having an interior opening, where the bezel is configured to be mounted to the lens with the rim engaged with an interior portion of the bezel and the front face exposed through the interior opening.

In particular embodiments, the rim of the lens is recessed from the front face, with the front face being substantially flush with the exterior surface of the bezel at the interior opening of the bezel. The pocket of the lens may include a pocket tab and the circuit board assembly may include a circuit board assembly tab, with the pocket tab being configured to receive the circuit board assembly tab to orient the circuit board assembly relative to the lens. The rim of the lens of the LED light units may additionally include mounting apertures configured for use in mounting the lens to a surface.

In further particular embodiments the optical structures comprise generally conical cavities in the lens, with the optical structures including an exterior opening on the front face and an inner opening opposite the front face, with the LEDs being aligned with said inner openings. The inner openings of the optical structures are smaller than the exterior openings, where the inner openings and exterior openings may either be axially aligned relative to a perpendicular orientation with respect to the front face, or axially offset from each other with respect to the front face.

In a still further particular embodiment, the lens includes an inner surface opposite the front face with the optical structures including an inner protuberance projecting upward from the inner surface and an outer protuberance projecting outward from the front face, with the optical structures directing light from the LEDs to substantially project at an angle relative to a plane defined by the front face. The inner protuberances may be generally conical and include a recess, with the recesses being disposed in alignment with respective LEDs. The outer protuberances may include first and second inclined portions, and a semicircular portion disposed between the first and second inclined portions, with the second inclined portion defining a steeper angle relative to the front face than the first inclined portion relative to the front face. Still further, the first inclined portions may be generally axially aligned with the inner protuberances, and apertures may be provided that are disposed adjacent each of the optical structures and extend through the lens.

The light unit is configured to be mounted to surfaces, such as walls, ceiling, cabinets and the like, to provide a thin, lightweight, and electrically efficient light unit. The ability of the lens to be configured to have different optical structures enables the light unit to project light in different angles and/or patterns such that it may be used for particular applications, including such as on vaulted ceilings. These and other objects, advantages, purposes and features of this invention will become apparent upon review of the following specification in conjunction with the drawings.

BRIEF DESCRIPTION OF THE DRAWINGS

FIGS. 13A-13C disclose rear perspective views of the LED light unit of FIG. 1 disclosing alternative mounting structures for the light unit;

DESCRIPTION OF THE PREFERRED EMBODIMENTS

Figure 1:
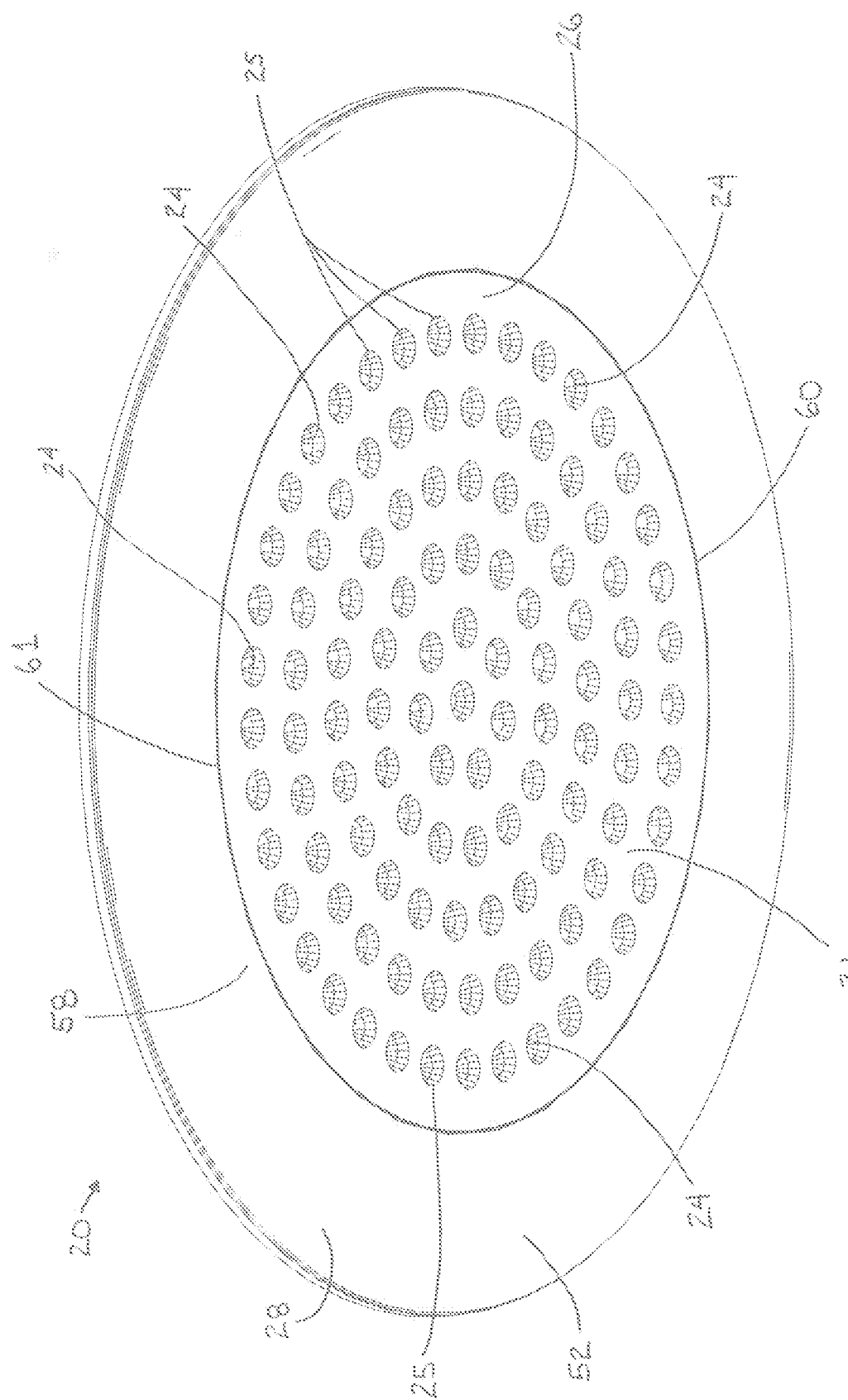
FIG. 1 is a front perspective view of a first embodiment of an LED light unit in accordance with the present invention.

The present invention will now be described with reference to the accompanying figures, wherein the numbered elements in the following written description correspond to like-numbered elements in the figures. A compact LED light unit 20, assembly, fixture, or luminaire in accordance with the present invention is disclosed in FIGS. 1-5A, with light unit 20 including multiple LED 22 devices or lights (FIG. 4) that project light into or at optical structures 24 positioned on a front lens or cover 26. The optical structures 24 affect light emitted from the LED 12 devices in desirable ways, as described below, including that they may be configured to project light at particular desirable angles relative to a plane defined by the front of cover 26. The light unit 20 includes a removable bezel or frame 28 disposed about a lens and circuit board assembly 30, where assembly 30 includes lens 26 as well as a circuit board or circuit board assembly 32 that supports LEDs 22. Light unit 20 is thin, light weight and compact, and may be readily installed to a wall, a ceiling, or the like, by way of various mounting features. Alternative lenses with differently configured optical structures may be employed to project light in alternative manners. As such the light units of the present invention may be mounted to horizontal or vertical surfaces, or even angled surfaces such as vaulted ceilings.

With further reference to FIGS. 1-5A, lens 26 includes an exterior or front surface 34 located on a central projecting portion 33, where in the illustrated embodiment central portion 33 is circular. A plurality of optical structures 24 are disposed in lens 26 at projecting portion 33, which in the first illustrated embodiment are formed to be generally conical, or frustoconical with curved inner walls. (See FIG. 5A). Optical structures 24 include an inner conical protuberance 63 that project upwardly from interior surface 64 of lens 26. The optical structures 24 further include an inner opening 23 and an exterior opening 25 on front surface 34, where inner opening 23 is of a smaller diameter than exterior opening 25. When assembled, LEDs 22 are axially aligned with the inner openings 23 of optical structures 24 and lens 26 comprises an opaque member constructed of a plastic material. In the illustrated embodiment lens 26 comprises an integral, unitary component that is formed by molding.

Figure 3A:
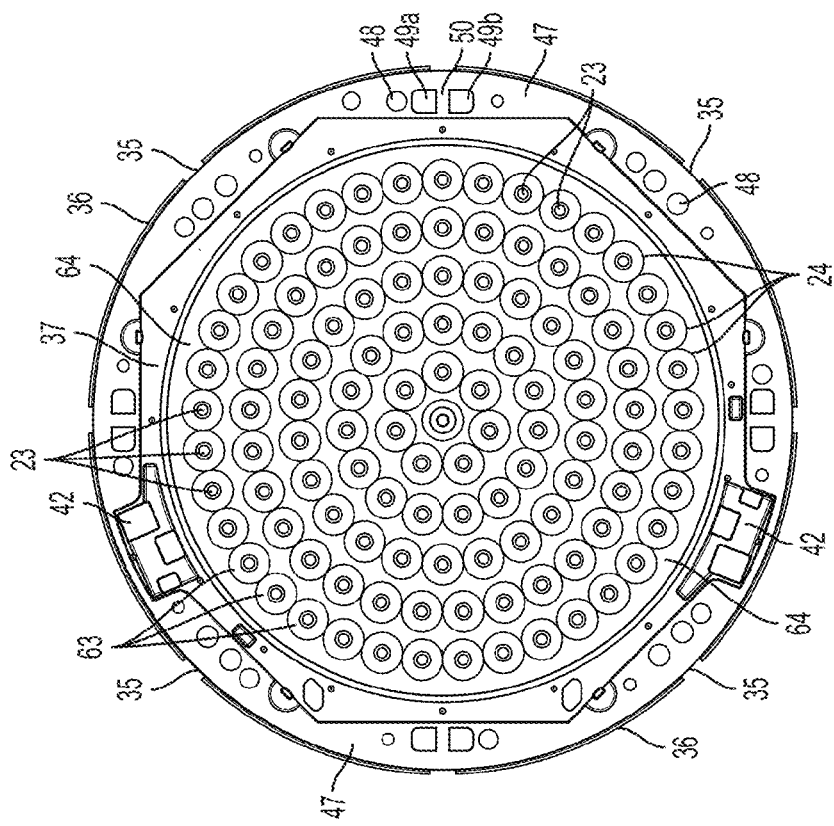
FIG. 3A is a rear plan view of the lens of the assembly of FIG. 3 with the circuit board assembly removed.
Figure 4:
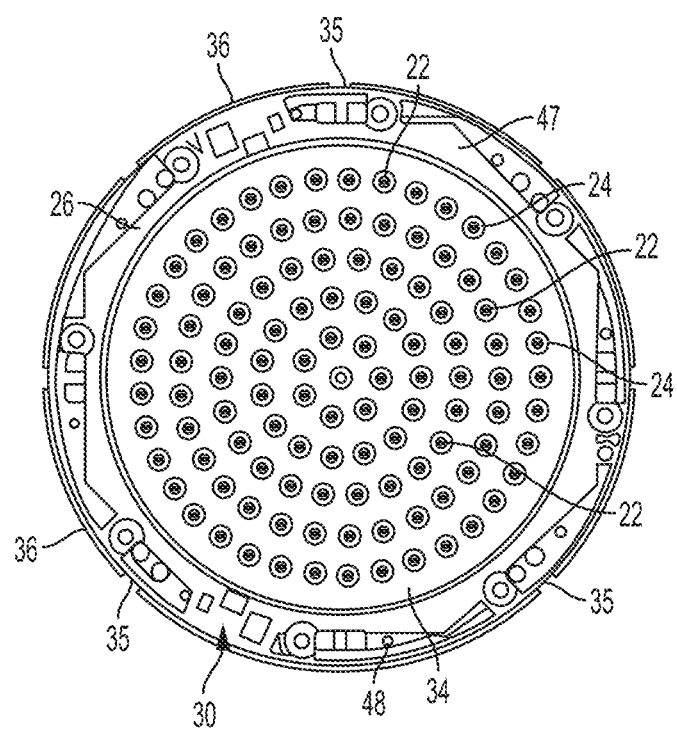
FIG. 4 is a front plan view of the assembly of FIG. 3.

As understood from FIGS. 3A and 4, LEDs 22 define five concentric rings of LEDs, where in the illustrated embodiment the LEDs are positioned to be disposed at the inner openings 23. It should be appreciated, however, that a lens may be constructed to have more or less than five such rings of optical structures, or alternatively, non-concentrically arranged optical structures. Lens 26 may also alternatively be translucent or transparent. An opaque lens may be used, for example, for typical flood style room lighting, while a transparent or clear lens may be used to provide a higher spread of light, such as may be used for upper illumination, such as with upper cabinets.

Figure 3:
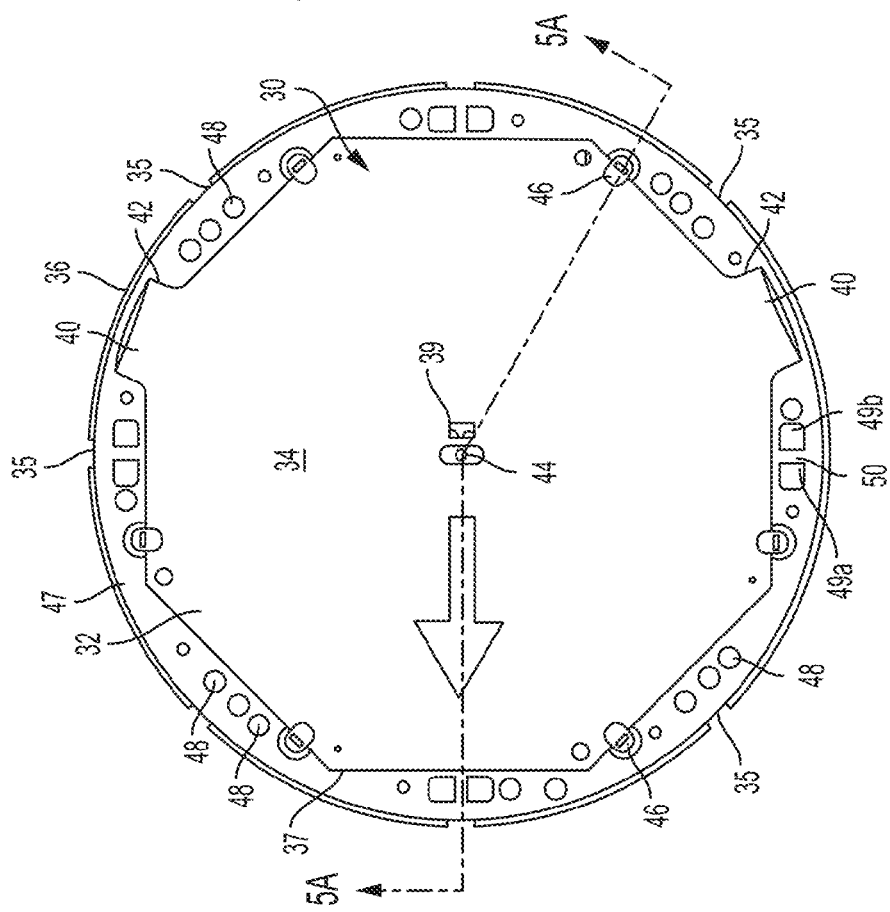
FIG. 3 is a rear plan view of the LED light unit of FIG. 1 shown with the bezel removed and discloses the lens and circuit board assembly.
Figure 5:
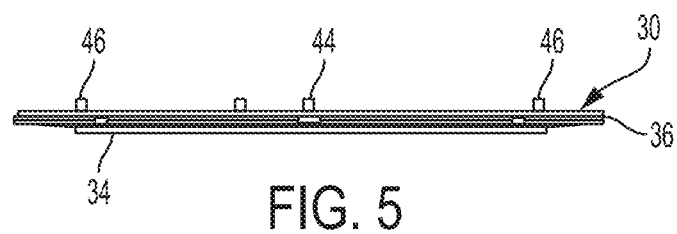
FIG. 5 is a side elevation view of the assembly of FIG. 3.
Figure 5A:
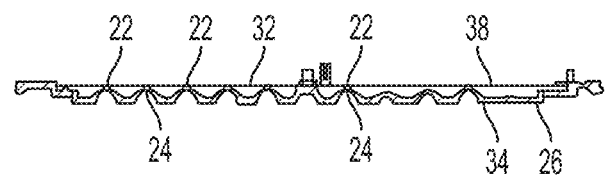
FIG. 5A is a side sectional view of the assembly of FIG. 3 taken along the line A-A shown in FIG. 3.
Figure 6:
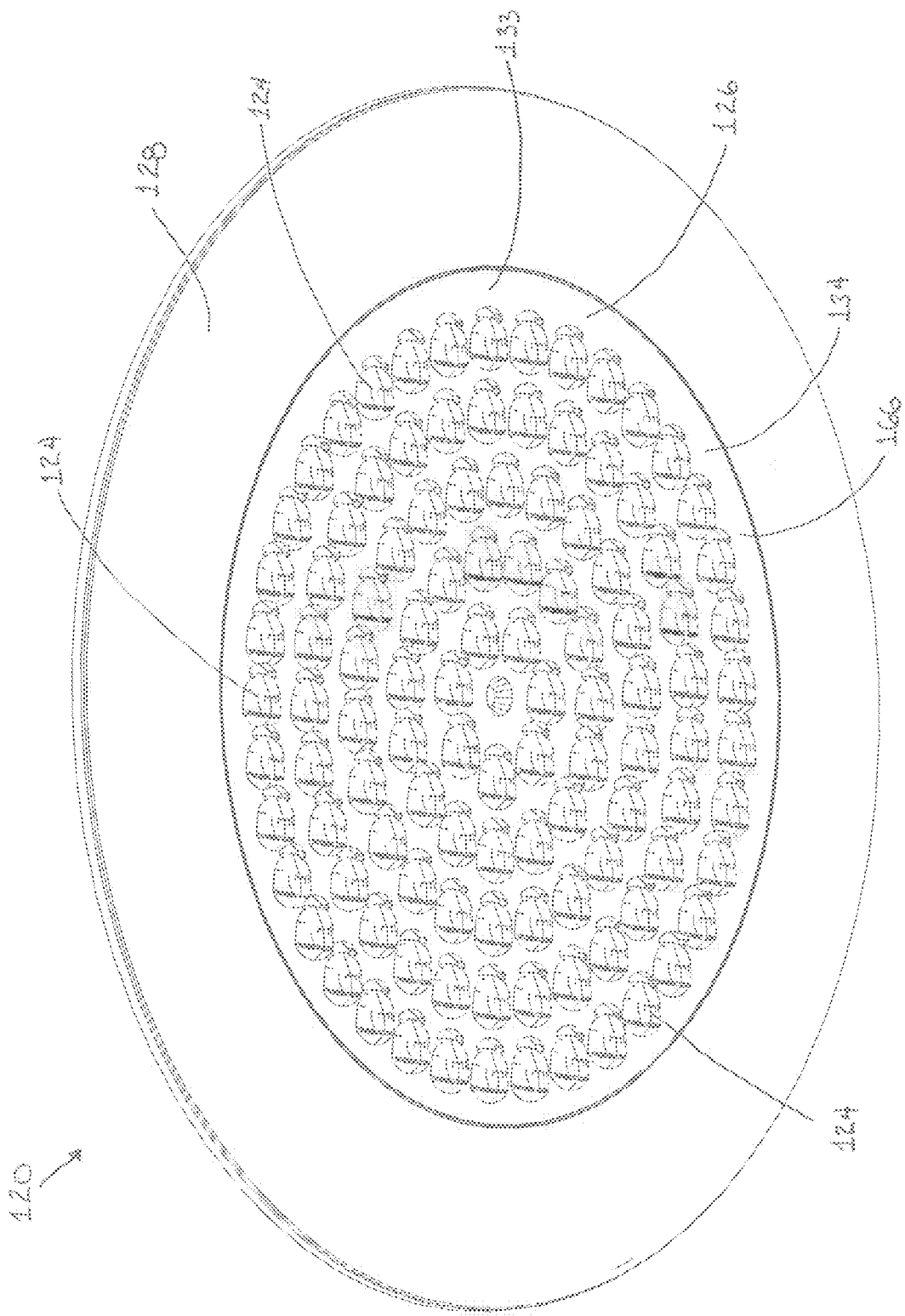
FIG. 6 is a front perspective view of an alternative embodiment of an LED light unit in accordance with the present invention.

As best understood from FIGS. 3-5, lens 26 is affixed or joined with circuit board assembly 32 to form assembly 30. Lens 26 includes a plurality of notches 35 disposed in a perimeter edge or lip 36 extending radially about the periphery of lens 26, where notches 35 are used to join assembly 30 to bezel 28, as discussed below. Circuit board assembly 32 in turn includes a back cover member 38 formed of a metallic material that functions as a heat sink for LEDs 22, and includes an electrical connector 39 for providing power and ground for circuit board assembly 32.

Figure 2:
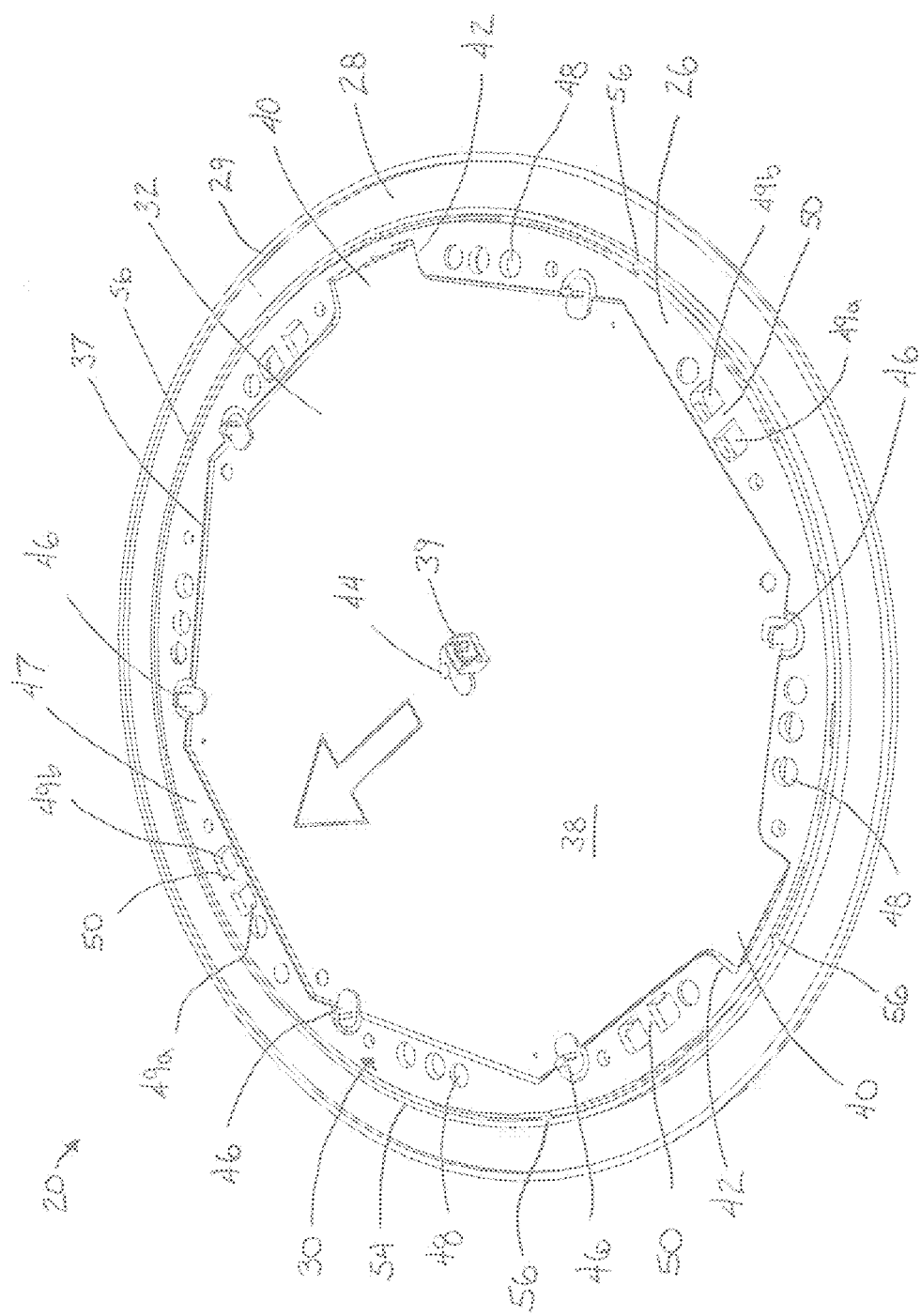
FIG. 2 is a rear or back perspective view of the LED light unit of FIG. 1.

As understood from FIG. 2, lens 26 includes a pocket or cavity 37 on the back portion of lens 26 within which circuit board assembly 32 is received, with circuit board assembly 32 via cover member 38 including planar tabs 40 that extend or nest into pockets 42 connected with cavity 37 to aid in aligning circuit board assembly 32 with lens 26. Pocket 37 is configured with multiple sides, with the sides and pockets 42 controlling the orientation of circuit board assembly 32 when installed into pocket 37 of lens 26 to thereby aid in orientation of LEDs 22 with optical structures 24.

Lens 26 further includes various projections or projection members, including a central retention member configured as a projection 44 and multiple peripheral retention members configured as projections 46. Central projection 44 extends through an aperture in circuit board assembly 32 to aid in aligning circuit board assembly 32 with lens 26 and, in turn aligning LEDs 22 with optical structures 24. Peripheral projections 46 are disposed about the perimeter of cavity 37. Upon circuit board assembly 32 being positioned within cavity 37, projections 44 and 46 may be melted to heat stack connect circuit board assembly 32 with lens 26. In the illustrated embodiment of FIG. 2, projections 44 and 46 are shown in a partially melted orientation. In practice, projections 44 and 46 would be fully melted and/or trimmed so as to be substantially flush. Alternatively, a lens may be connected, engaged, or joined with or to a circuit board by way of clips, glue or other retention mechanisms, including by way of projections or projection members for connecting or joining the components together.

Lens 26 further includes multiple mounting structures disposed about a peripheral rim 47 thereof, with the mounting structures including mounting apertures 48 of various sizes through which fasteners (FIG. 13B) may be driven to mount light unit 20 via assembly 30. The mounting structures further include multiple paired mounting apertures 49a, 49b separated by a support member or divider 50 that may be employed with a spring clip (FIG. 13A) to mount light unit 20, such as within an existing can of a recessed lighting structure. It should be appreciated that the various mounting structures disposed about the periphery of lens 26 enable assembly 30 to be mounted in various ways. Moreover, the disposition of the mounting structures at peripheral rim 47 enables the mounting structures and mounting features used to mount assembly 30 to be covered by bezel 28 to be hidden from view when fully mounted. As understood from FIG. 5, front surface 34 of lens 26 extends beyond rim 47 such that when bezel 28 is joined with assembly 30, the exterior surface 52 of bezel 28 is generally flush with front surface 34 of assembly 30. (See FIG. 1). That is, as understood from FIGS. 5 and 5A, rim 47 is recessed or setback from central projecting portion 33.

Bezel 28 includes an upright internal wall 54 with multiple projections or tabs 56 disposed thereon that dispose radially inwardly. Bezel 28 further includes a portion defining a lip or brim 58 extending radially inward from wall 54 with brim 58 defining an opening 60 into which central projecting portion 33 of lens 26 extends to expose front surface 34. When assembling bezel 28 to assembly 30, projections 56 are configured to be initially aligned with and received in or by notches 35 in lip 36 of lens 26. Bezel 28 may then be rotated such that projections 56 are no longer aligned with notches 35 whereby projections are disposed on lip 36 to retain bezel 28 to assembly 30. When so received, brim 58 of bezel 28 covers rim 47 of assembly 30. Wall 54 and brim 58 thus define an interior pocket for receiving rim 47 of lens 26.

Moreover, when so received, exterior surface 52 of bezel 28 is generally flush with front surface 34 of assembly 30, for example with the edge 61 surrounding opening 60, with assembly 30 being recessed within the rearward directed outer edge 29 of bezel 28. As such, light unit 20 defines a substantially slim or thin lighting fixture, where in the illustrated embodiment light unit 20 is only approximately 0.25 inches thick. As discussed in more detail below, light unit 20 is thus readily mountable to a ceiling, wall, or the like, including within a can of an existing recessed lighting structure, with bezel 28 then mounted thereto.

An alternative LED light unit 120 in accordance with the present invention is shown in FIGS. 6-11, where light unit 120 is of substantially similar construction to light unit 20, with similar features or components being identified in FIGS. 6-11 with "100" added to the reference numerals relative to features in FIGS. 1-5A. Due to the similarities, that not all of the details of the like configured components and features are discussed herein.

Light unit 120 includes a bezel 128 disposed about a lens and circuit board assembly 130, where assembly 130 includes a lens or front cover 126 and circuit board assembly 132. Lens 126 includes a plurality of optical structures 124, but in contrast to lens 26 the lens 126 of light unit 120 is translucent and in contrast to the optical structures 24 of lens 26 that define cavities in lens 26, optical structures 124 include protuberances 163 extending outwardly from front surface 134 of lens 126, where front surface 134 is part of central projecting portion 133. Optical structures 124 are configured to internally reflect and/or refract light output by LEDs 122 to angularly project or direct light from lens 126. As such, light unit 120 is suitably configured for use in mounting at an angle, such as on or at or to a vaulted ceiling, with the light projected from light unit 120 then being directed generally downwardly.

Figure 10:
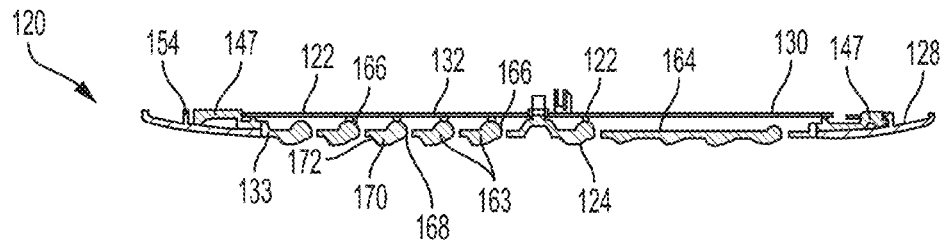
FIG. 10 is a side sectional view of the light unit of FIG. 8 taken along the line 10-10 shown in FIG. 8.
Figure 10A:
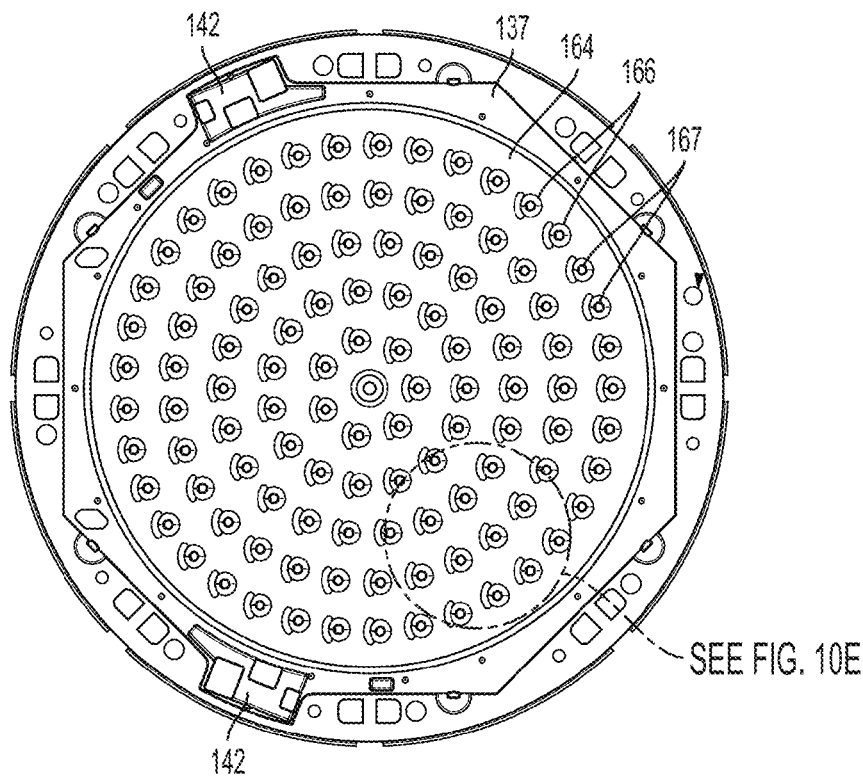
FIG. 10A is a rear plan view of the lens of the LED light unit of FIG. 8 shown with the bezel and circuit board assembly removed.
Figure 10B:
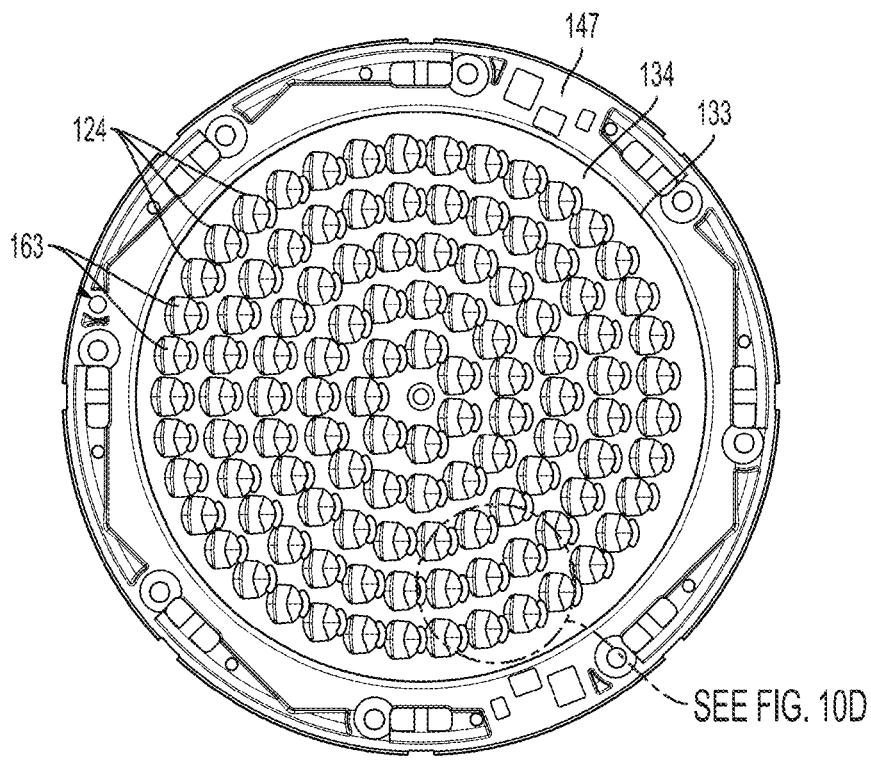
FIG. 10B is a front plan view of the lens of FIG. 10A.

As best understood from FIG. 10, lens 126 includes an inner surface 164, with optical structures 124 including an inner portion 166 extending upward from inner surface 164 toward circuit board assembly 132 and its associated LEDs 122, with LEDs 122 being axially aligned with inner portions 166, and in particular being aligned with a generally circular pocket or indent or recess 167 formed on inner portion 166. Inner portions 166 define protuberances that are configured to be generally conical or frustoconical and in close proximity to LEDs 122. As understood from FIGS. 10 and 10C, pocket 167 includes a radiused or convex surface 169, with the surface 169 being deeper on one side of pocket 167.

Figure 10C:
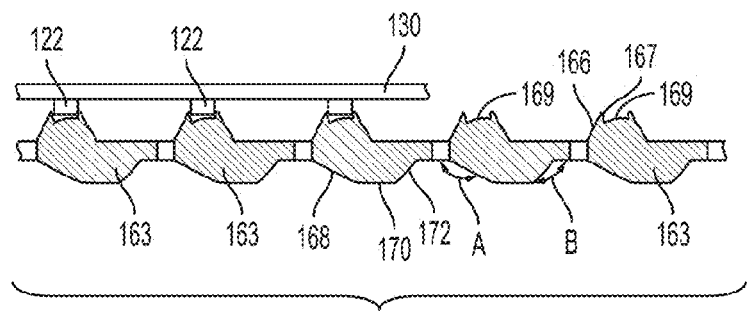
FIG. 10C is a close up cross sectional partial view of optical structures of FIG. 10A.
Figure 10D:
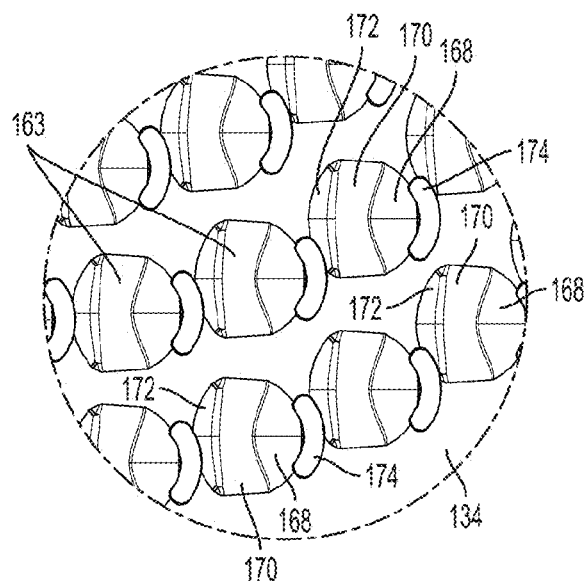
FIG. 10D is a close up front plan view of optical structures from FIG. 10B.
Figure 10E:
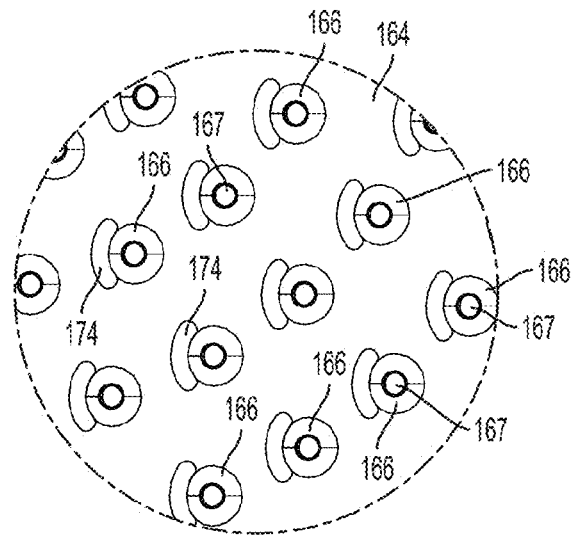
FIG. 10E is a close up rear plan view of optical structures from FIG. 10A.
Figure 11:
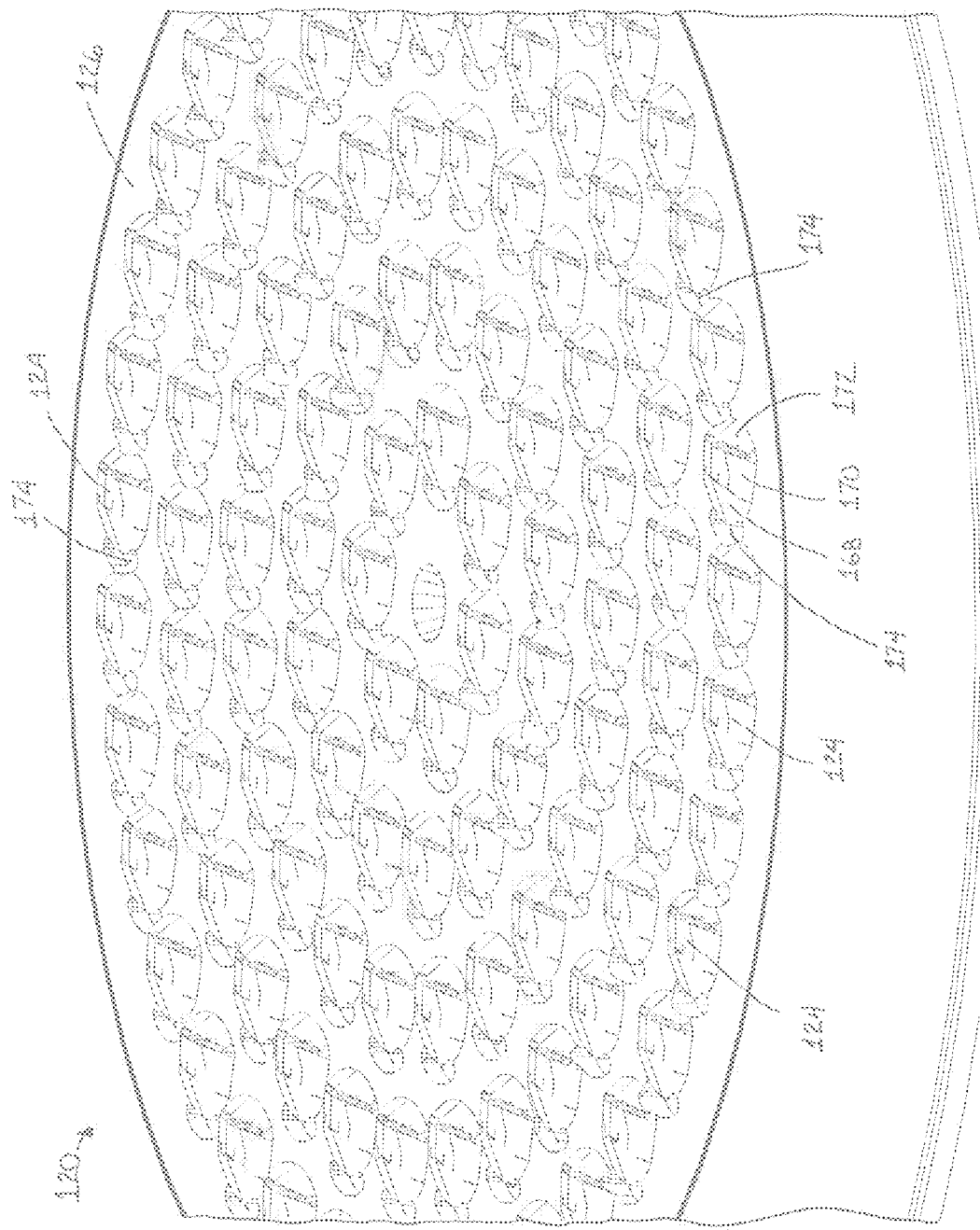
FIG. 11 is a close up front partial perspective view of the optical structures of the lens from the light unit of FIG. 6.

With further reference to FIG. 11, the protuberance portion 163 of optical structures 124 protruding from front surface 134 includes a first inclined portion 168 that is axially aligned with LEDs 122 and inner portion 166. As shown, first inclined portion 168 extends outwardly from front surface 134 at an angle. Optical structures 124 further include a generally rounded or semicircular portion 170 disposed adjacent to first inclined portion 168, where semicircular portions 170 forms a partial cylindrical protuberance from front surface 134. Optical structures 124 additionally include a second inclined portion 172 on the opposite side of semicircular portion 170 from first inclined portion 168. Second inclined portion 172 has a slightly convex front surface and extends at a steeper angle A relative to front surface 134 than the angle B of first inclined portion 168 relative to front surface 134 (FIG. 10C). Semicircular portion 170 is thus disposed between first inclined portion 168 and second inclined portion 172 to define an approximately U-shaped separation there between. In addition, apertures 174 are formed in lens 126 at each of optical structures 124, where apertures 174 define slightly arcuate openings at the base of each of first inclined portions 168.

As also understood from FIG. 11, each of the second inclined portions 172 are oriented to face or be directed toward the same direction. In similar manner to light unit 20, optical structures 124 define five concentric rings on light unit 120. When light unit 120 is mounted at a non-horizontal angle, second inclined portions 172 are positioned to be positioned or directed downward such that they are vertically lower than their associated first inclined portion 168, with light from LEDs 122 being internally reflected and/or refracted in optical structures 124 to be directed generally downwardly. That is, with light unit 120 mounted at a non-horizontal angle, light projected from LEDs 122 will be directed generally vertically downwardly. It should be appreciated that the geometry of optical structures 124 may be altered, such as the size, angle or shape of the first and second inclined structures and semicircular portion, to provide alternatively oriented or angled light projection.

Figure 7:
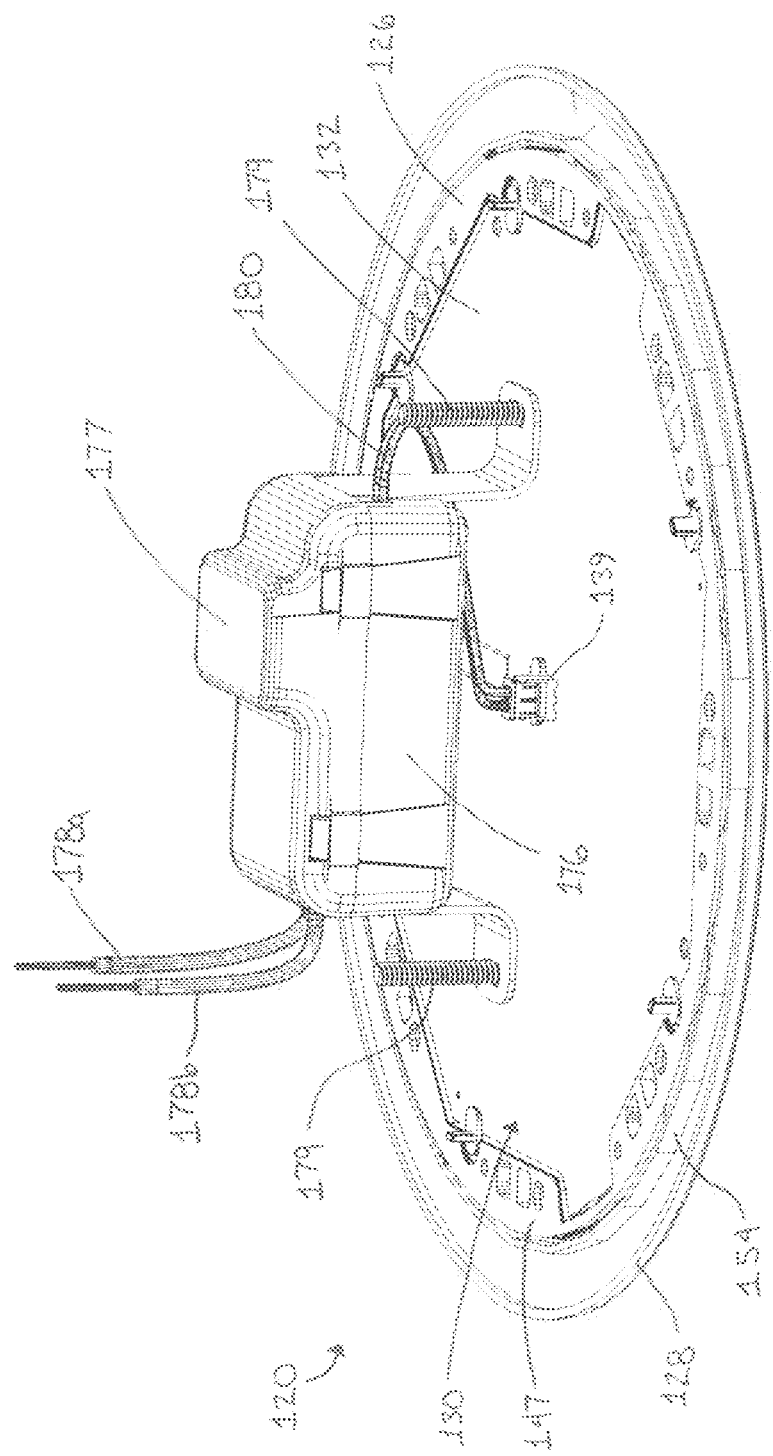
FIG. 7 is a rear or back perspective view of the light unit of FIG. 6 shown with a driver mounted thereto.
Figure 8:
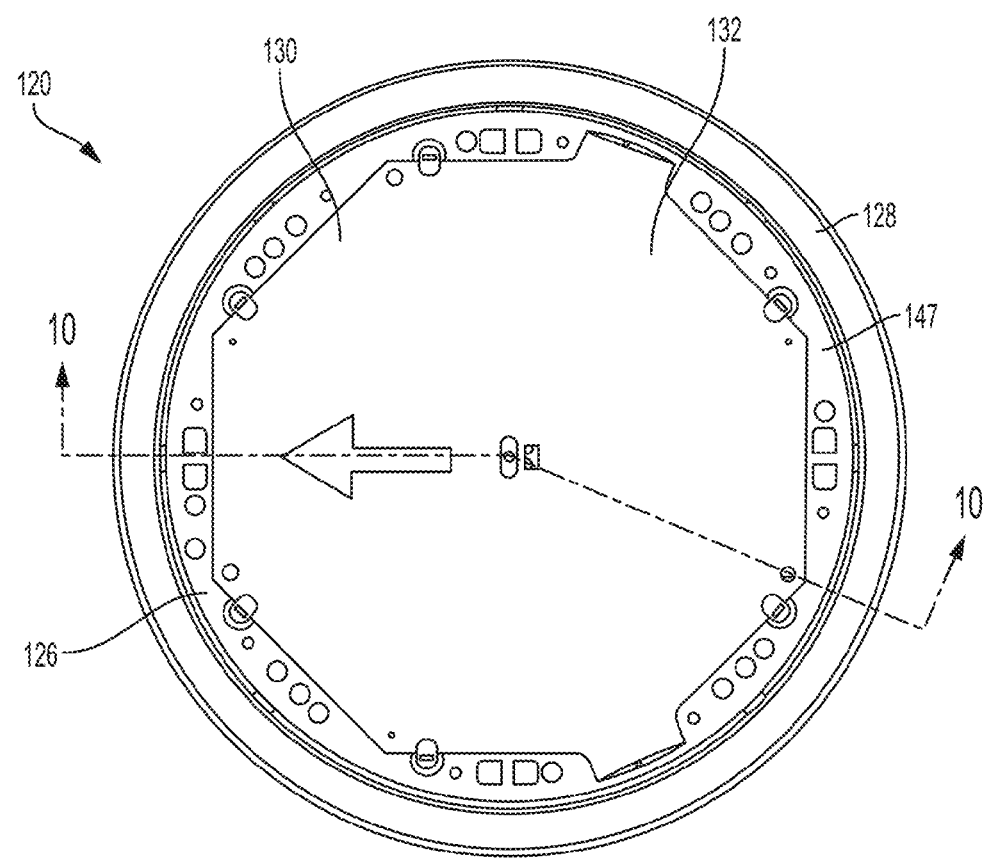
FIG. 8 is a rear plan view of the LED light unit of FIG. 6 shown without the driver of FIG. 7.
Figure 9:
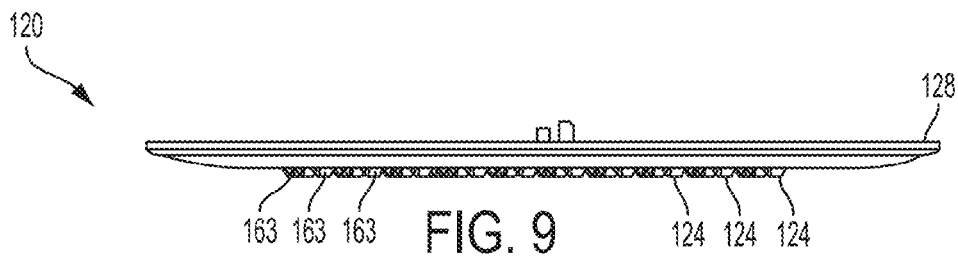
FIG. 9 is a side elevation view of the LED light unit of FIG. 8.

With reference to FIG. 7, light unit 120 is shown connected with a driver 176 that operates as a convertor to receive AC current via wires 178a, 178b and provide circuit board assembly 132 with the appropriate current for powering LEDs 122. As shown, driver 176 includes leads 180 that plug into electrical connector 139. Driver 176 is shown to include a bracket 177 through which fasteners 179 are disposed for mounting driver 176, where the fasteners 179 are not disposed on or through light unit 120.

Figure 12:
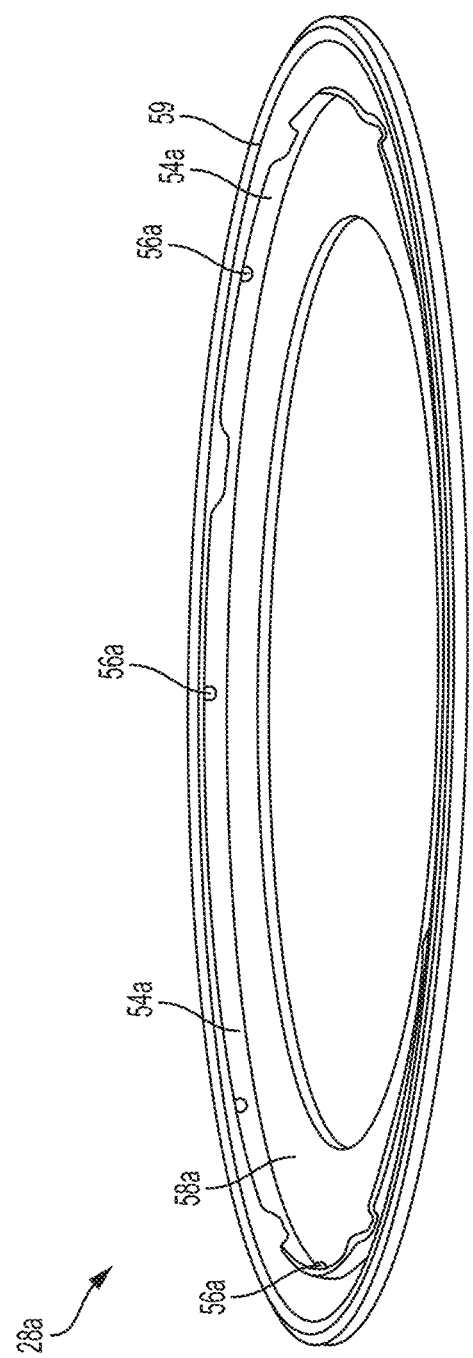
FIG. 12 is an alternative bezel for an LED light unit in accordance with the present invention.

Referring now to FIG. 12, an alternative bezel 28a is disclosed that is of substantially similar construction to bezels 28 and 128 discussed above. Bezel 28a includes an internal wall 54a with projections 56a disposed thereabout and internally oriented brim 58a. Bezel 28a further includes an optional gasket 59 for sealing against a rim of a lens and circuit board assembly, such as rim 47 of assembly 30, or against a surface to which the light unit is mounted.

Referring now to FIGS. 13A-13C, LED light unit 20 is shown with various mounting features used to mount led light unit. FIG. 13A discloses spring clips 182 disposed through apertures 49a, 49b to be engaged with support member 50, where spring clips 182 may be used to mount assembly 30 into the can of a recessed lighting structure. In the illustrated embodiment spring clips 182 are V-shaped structures with outwardly oriented ends or feet that engage with the can structure. The base of the "V" structure engages with the support member 50. FIG. 13B discloses fasteners 184 that are disposed through apertures 48 and that may be used to mount assembly 30 to a ceiling, wall, or the like. Still further, FIG. 13C discloses adhesive members 186, which in the illustrated embodiment comprise double sided adhesive tape that may be used to mount assembly 30. Upon mounting assembly 30, bezel 28 may then be affixed thereto as discussed above.

Figure 14:
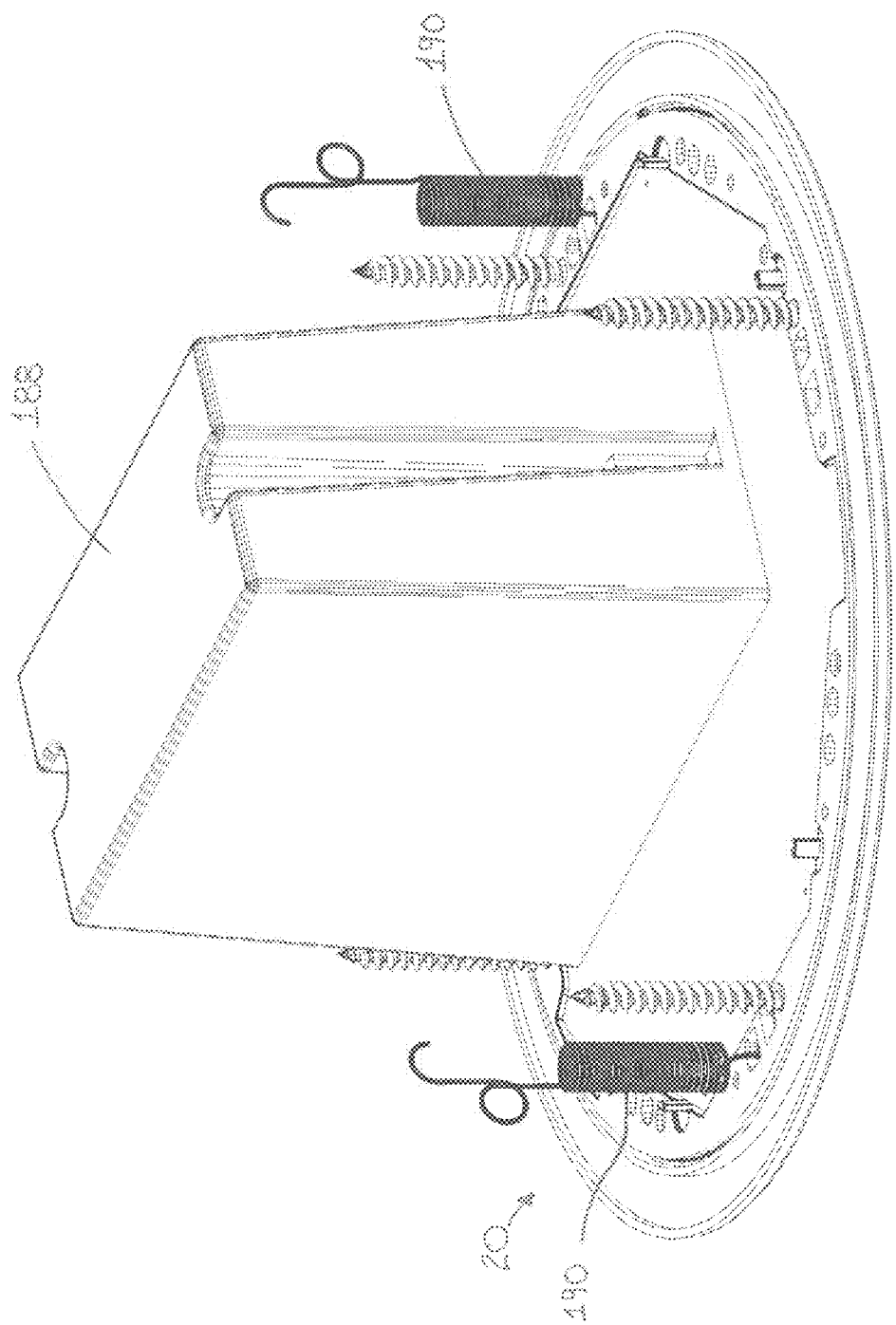
FIG. 14 discloses a rear perspective view of the LED light unit of FIG. 1 with mounting structures and a gang box.

FIG. 14 illustrates light unit 20 configured in association with a gang box or junction box 188, where gang box 188 would be mounted within a ceiling, for example. A driver 176 would then be mounted within gang box 188, such as by way of fasteners 179 being secured into gang box 188. The light unit 20 may then be mounted or connected to the gang box 188 or affixed to the ceiling by way of fasteners 184. Fasteners 184 may be used to mount light unit 20 to a wall or ceiling or the like. Alternatively, a light unit 20 could be assembled to a recessed can lighting structure, such as by way of springs 190 or spring clips 182 without a gang box 188, such as to structure 190 or 195 as shown in FIGS. 15A and 15B discussed below.

Figure 15A:
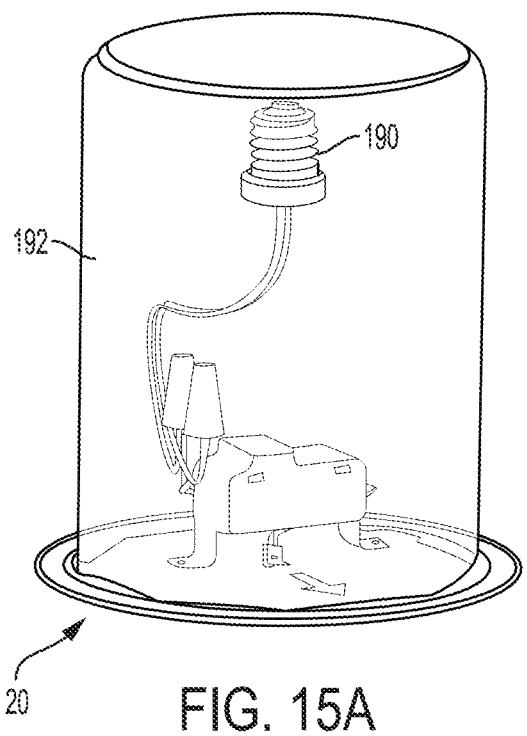
FIG. 15A discloses the LED light unit of FIG. 1 mounted to a recessed can lighting assembly.
Figure 15B:
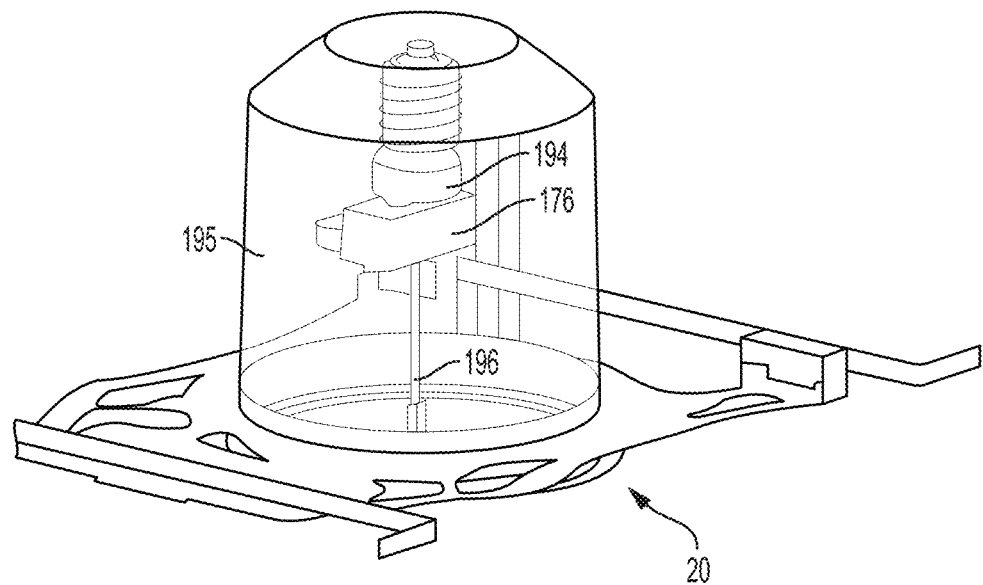
FIG. 15B discloses the LED light unit of FIG. 1 mounted to another recessed can lighting assembly.

FIGS. 15A and 15B discloses exemplary embodiments of the light unit 20 mounted to a recessed can lighting device. In FIG. 15A, the driver 176 is connected to the bulb receiving receptacle 192 of the recessed light device 190. In FIG. 15B, an Edison adapter or medium mogul base 194 connected to recessed light device 195 is provided with leads 196 then plugged into connector 39. It should thus be understood that light units 20 and 120 are well adapted and configured to be retro fit, mounted or used with existing recessed can lighting structures to provide more efficient lighting. Still further, it should be further appreciated that light units 20 and 120 are well adapted and configured to be used in situations in which there are space constraints behind a wall or ceiling member to which the light units 20, 120 may be mounted. For example, in particular environments can lighting devices may not be able to be used due to limited space behind the drywall of a wall or ceiling, or other building material, due to an obstruction behind the surface such as due to ductwork, piping, or other building structures. In such cases light units 20, 120 may be used with just a gang box that requires much less space than a can lighting structure, or may be remotely located from a gang box with leads extending thereto. For example, a light unit in accordance with the present invention may be mounted to a wall or ceiling, such as by screws or double sided tape, with a junction box 188 or other suitable enclosure being remotely located from the light unit that may include a driver 176 or other such power supply device. Leads may then be strung to the light unit, such as an extended length of leads 180, from the junction box 188. This will thereby enable a light unit to be located on surfaces behind which an obstruction would otherwise prevent installation of an adjacent power supply device and/or junction box.

Figure 16A:
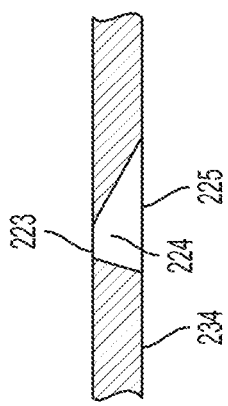
FIG. 16A is a partial cross sectional view of the lens of FIG. 16 showing an optical structure.
Figure 16:
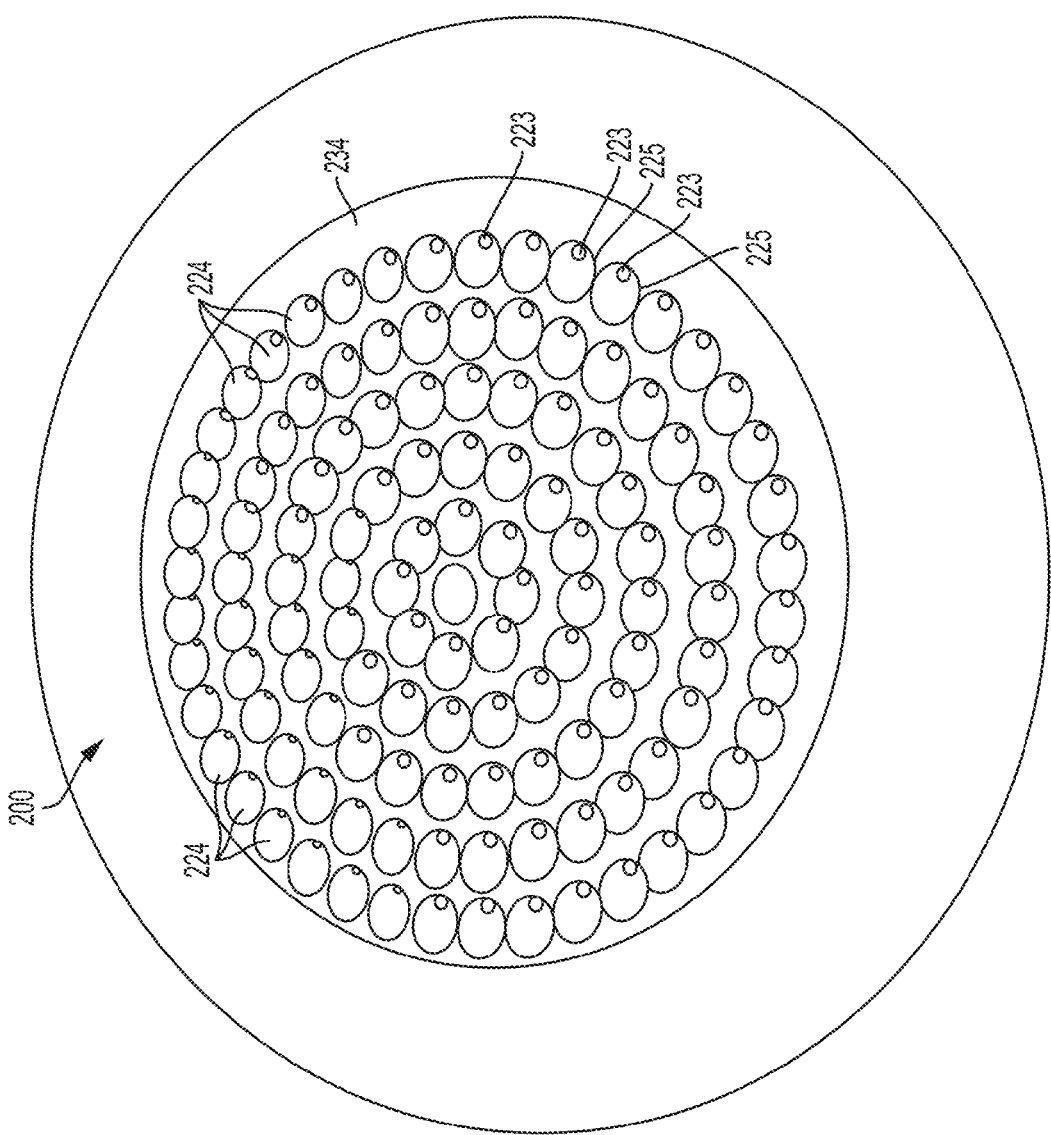
FIG. 16 is a front perspective view of another alternative embodiment of an LED light unit in accordance with the present invention.

Yet another alternative LED light unit in accordance with the present invention is disclosed in FIG. 16 as light unit 220. Light unit 220 is substantially similar to light unit 20 discussed above, but includes alternatively configured optical structures 224. Whereas optical structures 24 of light unit 20 have a generally conical configuration in which openings 23 and 25 are axially aligned, optical structures 224 are configured to have a generally tilted conical or tilted frustoconical configuration. That is, the axis of the optical structures 224 is not perpendicular with the front surface or face 234 of the light unit 220. As such, inner openings 223 are not axially aligned with exterior openings 225 of front face 234. Optical structures 224 thereby aid in or promote directing light outward from light unit 220 at an angle relative to front surface 234 with LEDs being aligned with inner openings 223. Light unit 220 is thus well suited for mounting at an angle, such as to a vaulted ceiling, while directing light generally downward.

Figure 17A:
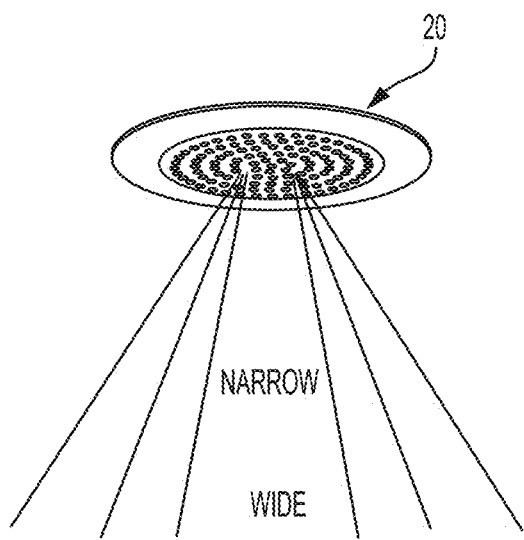
FIGS. 17A-17C disclose light beam patterns obtainable with LED light units in accordance with the present invention.
Figure 17B:
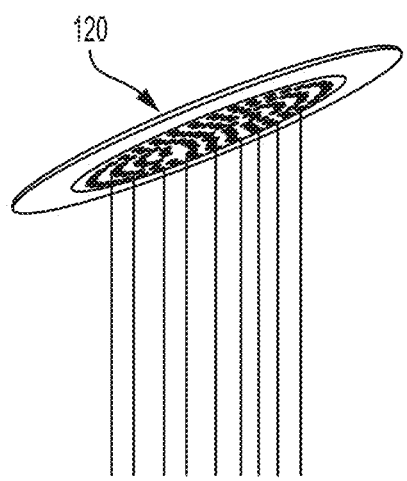
Figure 17C:
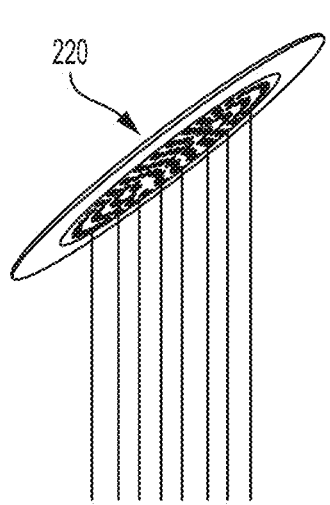

Referring now to FIGS. 17A-17C, the general direction of projected light is illustrated with respect to light units 20, 120 and 220. As there understood, light unit 120 is configured for mounting at an approximately 20 degree angle and light unit 220 is configured for mounting at an approximately 30 degree angle relative to horizontal. It should of course be appreciated, however, that alternative angles and configurations may be obtained. As noted, the geometry of optical structures of light units 120 and 220 may be alternatively configured for mounting the light units at greater or smaller angles. Still further, light units 120 and 220 may be mounted to a generally horizontal surface, such as in the mounting arrangement illustrated in FIG. 17A, wherein light units 120 and 220 can provide a wall washer feature from the angled light projected from the optical structures. Light units, such as lights units 20, 120 and 220, via their respective optical structures, may be configured to project light in a generally overall round pattern, that is, when light projected from the plurality of optical structures is considered together. Alternatively, light units may be configured to project light in a generally overall obular or oval pattern.

In the illustrated embodiments light units 20, 120 and 220 are configured to have a circular bezel and a circular lens. It should be appreciated that alternatively configured bezels and lenses may be employed within the scope of the present invention. For example, light units may be configured to be square or rectangular, or to have non-straight sides or edges. The bezels in such embodiments may connect to the associated lens-circuit assembly in an alternative manner, such as a snap-fit, or hooked connection, or the like.

Figure 18:
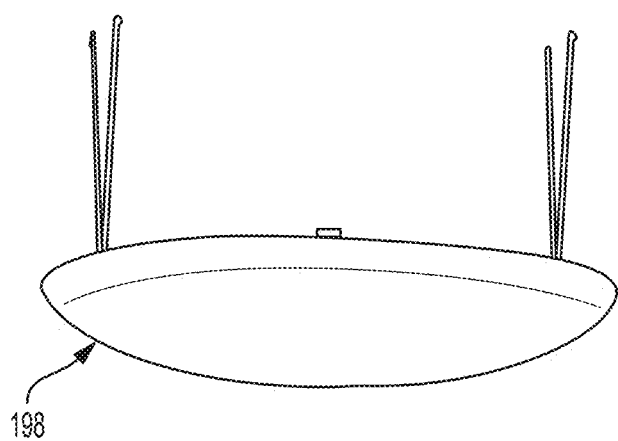
FIG. 18 discloses a diffuser affixed to the LED light unit of FIG. 1.

As shown in FIG. 18, a diffuser 198 may be separately connected to a light unit in accordance with the present invention. In such an embodiment, the diffuser 198 may be connected to or with or as party of a bezel, or may be connected to a lens-circuit assembly in place of a bezel.

Figure 19A:
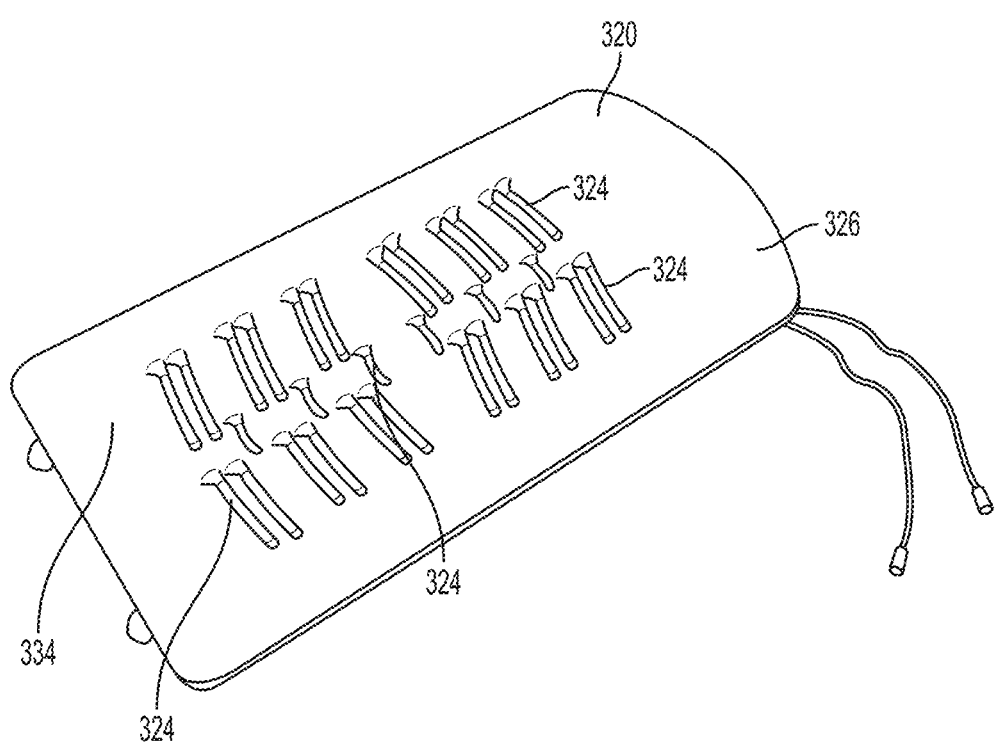
FIG. 19A is a top or front perspective view of an alternative embodiment of an LED light unit.
Figure 19B:
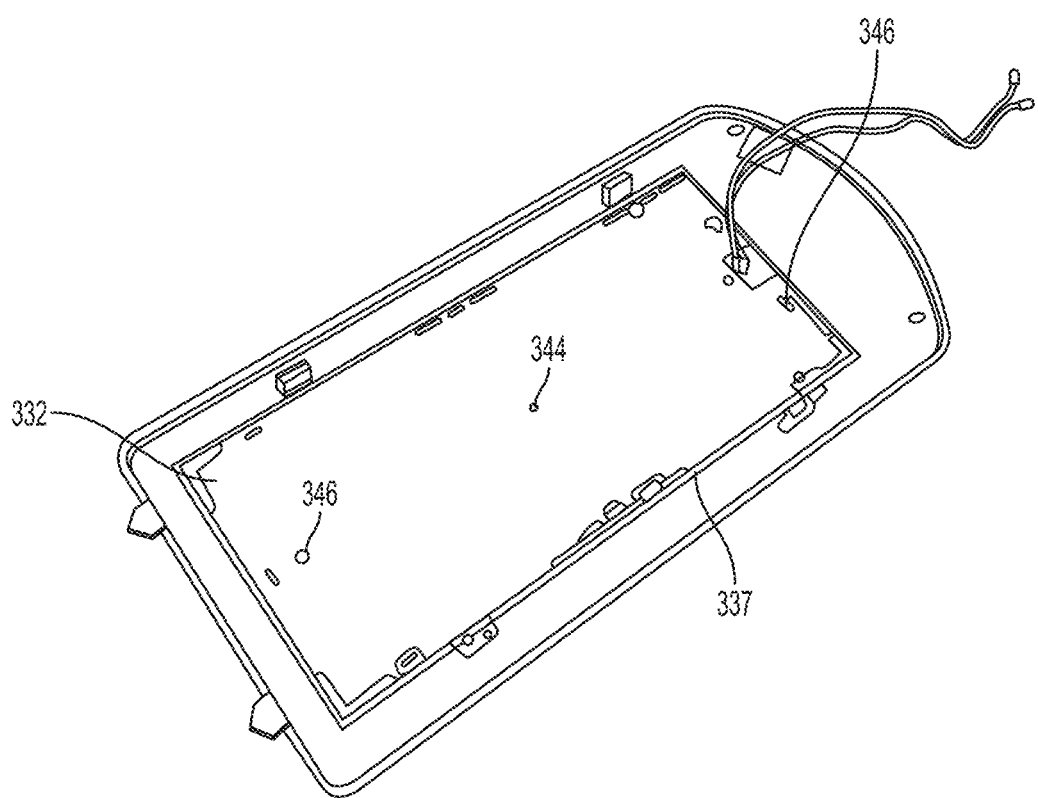
FIG. 19B is a bottom perspective view of the light unit of FIG. 13.

Referring now to FIGS. 19A and 19B, an alternative light unit 320 in accordance with the present invention is disclosed. Light unit 320 includes a front cover 326 connected to a circuit board assembly 332, with cover 326 including a cavity 337 for receiving assembly 332. Cover 326 further includes various projections 344, 346 that extend into assembly 332 for aligning assembly 332 to cover 326. Cover 326 further includes various optical structures 324 that are configured as elongate apertures of various lengths. Of note is that on one side of the elongate apertures the cover 326 is sloped, wherein the cover 326 slopes from the aperture to the front surface 334 of the cover 326. On the opposite elongate length of the aperture, the cover 326 generally forms a wall portion. Thus, optical structures 324 aid in directing light in a desired direction at an angle from LEDs of assembly 332. Of further note is that each optical structure is associated with multiple LEDs, whereas in the embodiments of light units 20, 120 and 220 a single LED is associated with each optical structure.

In the LED light units in accordance with the present invention, the alignment and proximity of optical structures to LEDs and the geometric configuration of optical structures aids in collecting and directing light projected from the LEDs to reduce the waste or spread of the projected light thereby increasing the efficiency of the light units of the present invention. For example, the construction and configuration of optical structures with respect to the LEDs effectively increases the luminous efficacy or luminous efficiency of the light units due to the collection of light into the optical structures. Accordingly, the light units provide a more efficient use of the lumen output of the LEDs whereby sufficient luminosity is provided while reducing the cost.

Light units having numerous alternative arrangements may be constructed in accordance with the present invention. For example, alternative numbers and arrangements of optical structures on front cover may be utilized to produce differing lighting structures producing more or less light. Alternative elongate optical structures may be formed to be diagonal or have curves or bends, and/or not extend the entire length or width of the front cover, and/or elongate and generally frustoconical optical structures may be employed together on a light unit.

Front covers or front cover assemblies in accordance with the present invention may be formed of a plastic or glass material and may include color tinting. Light units including LED lights that are optically aligned with receptacles of optical structures decrease the waste of light caused by the divergence of projected light, thereby improving the efficiency of the light unit by capturing, directing, and/or channeling projected light through the front cover to provide an acceptable lighting structure for a given application with a minimized cost. The LED lights may be optically aligned with and mounted in substantial proximity to the optical structures such that projected light is directed into a receptacle of the optical structure for directing or channeling the projected light through the front cover. Light unit thus provides a compact and efficient device for illuminating distally located objects that may be used, for example, as an under cabinet light, a recessed ceiling or wall light, an appliance light unit, or other such lighting unit, and may be installed as original equipment or may be retrofitted to existing structures and surfaces.

Changes and modifications in the specifically described embodiments can be carried out without departing from the principles of the present invention which is intended to be limited only by the scope of the appended claims, as interpreted according to the principles of patent law including the doctrine of equivalents.

The embodiments of the invention in which an exclusive property or privilege is claimed are defined as follows:

1. An LED light unit, said light unit comprising:
   a circuit board assembly with a plurality of light emitting diodes (LEDs);
   a lens, said lens including a plurality of optical structures, a front face, and a rim disposed about said front face, said lens further including a pocket on a back portion of said lens opposite said front face; and
   a bezel, said bezel including an interior opening;
   said circuit board assembly being mounted within said pocket of said lens whereby said LEDs are optically aligned with said optical structures, and wherein said bezel is configured to be mounted to said lens with said rim engaged with an interior portion of said bezel and said front face exposed through said interior opening.

2. The LED light unit of claim 1, wherein said rim of said lens is recessed from said front face.

3. The LED light unit of claim 2, wherein said front face is substantially flush with an exterior surface of said bezel at said interior opening of said bezel.

4. The LED light unit of claim 1, wherein said pocket of said lens includes a pocket tab and wherein said circuit board assembly includes a circuit board assembly tab, and wherein said pocket tab is configured to receive said circuit board assembly tab to orient said circuit board assembly relative to said lens.

5. The LED light unit of claim 1, wherein said optical structures comprise generally conical cavities in said lens, said optical structures including an exterior opening on said front face and an inner opening opposite said front face, with said LEDs being aligned with said inner openings.

6. The LED light unit of claim 5, wherein said inner opening of said optical structures is smaller than said exterior opening, and wherein said inner opening and said exterior opening of said optical structures are axially aligned relative to a perpendicular orientation with respect to said front face.

7. The LED light unit of claim 5, wherein said inner opening of said optical structures is smaller than said exterior opening, and wherein said optical structures comprise generally angled conical cavities in said lens whereby said inner opening of said optical structures is axially offset from said exterior opening relative to a perpendicular orientation with respect to said front face.

8. The LED light unit of claim 1, wherein said lens includes an inner surface opposite said front face, and wherein said optical structures include an inner protuberance projecting upward from said inner surface and an outer protuberance projecting outward from said front face, and wherein said optical structures direct light from said LEDs to substantially project at an angle relative to a plane defined by said front face.

9. The LED light unit of claim 8, wherein said inner protuberance of said optical structures is generally conical and includes a recess, with said recess being disposed in alignment with respective ones of said LEDs.

10. The LED light unit of claim 8, wherein said outer protuberance of said optical structures includes a first inclined portion, a second inclined portion, and a semicircular portion disposed between said first and second inclined portions, and wherein said second inclined portion defines a steeper angle relative to said front face than said first inclined portion relative to said front face.

11. The LED light unit of claim 10, wherein said first inclined portion of said optical structures is generally axially aligned with said inner protuberance.

12. The LED light unit of claim 11, further including an aperture disposed adjacent each said optical structure, with each said aperture extending through said lens.

13. The LED light unit of claim 1, wherein said rim of said lens includes mounting apertures, said mounting apertures configured for use in mounting said lens to a surface.

14. The LED light unit of claim 1, wherein said light unit is circular and wherein said rim is disposed about the entire periphery of said lens.

15. An LED light unit, said light unit comprising:
    a circuit board assembly with a plurality of light emitting diodes (LEDs);

a lens, said lens including a plurality of optical structures, a front face, and a rim disposed about said front face; and a bezel, said bezel including an interior opening;

said circuit board assembly being mounted with said lens whereby said LEDs are optically aligned with said optical structures, and wherein said bezel is configured to be mounted to said lens with said rim engaged with an interior portion of said bezel and said front face exposed through said interior opening.

16. The LED light unit of claim 15, wherein said optical structures comprise generally conical cavities in said lens, said optical structures including an exterior opening on said front face and an inner opening opposite said front face, with said LEDs being aligned with said inner openings.

17. The LED light unit of claim 16, wherein said inner opening of said optical structures is smaller than said exterior opening, and wherein said inner opening and said exterior opening of said optical structures are axially aligned relative to a perpendicular orientation with respect to said front face.

18. The LED light unit of claim 16, wherein said inner opening of said optical structures is smaller than said exterior opening, and wherein said optical structures comprise generally angled conical cavities in said lens whereby said inner opening of said optical structures is axially offset from said exterior opening relative to a perpendicular orientation with respect to said front face.

19. The LED light unit of claim 15, wherein said lens includes an inner surface opposite said front face, and wherein said optical structures include an inner protuberance projecting upward from said inner surface and an outer protuberance projecting outward from said front face, and wherein said optical structures direct light from said LEDs to substantially project at an angle relative to a plane defined by said front face.

20. The LED light unit of claim 19, wherein said inner protuberance of said optical structures is generally conical and includes a recess, with said recess being disposed in alignment with respective ones of said LEDs.

21. The LED light unit of claim 19, wherein said outer protuberance of said optical structures includes a first inclined portion, a second inclined portion, and a semicircular portion disposed between said first and second inclined portions, and wherein said second inclined portion defines a steeper angle relative to said front face than said first inclined portion relative to said front face.

22. The LED light unit of claim 21, wherein said first inclined portion of said optical structures is generally axially aligned with said inner protuberance.

23. The LED light unit of claim 22, further including an aperture disposed adjacent each said optical structure, with each said aperture extending through said lens.

* * * * *